United States Patent
Akkaraju et al.

(10) Patent No.: US 10,176,283 B2
(45) Date of Patent: Jan. 8, 2019

(54) EQUIVALENCE CHECKING OF ANALOG MODELS

(71) Applicant: Synopsys, Inc., Mountain View, CA (US)

(72) Inventors: Vijay Akkaraju, San Francisco, CA (US); Chun Chan, Cupertino, CA (US); Che-Hua Shih, Zhubei (TW); Chia-Chih Yen, Taipei (TW)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 15/268,475

(22) Filed: Sep. 16, 2016

(65) Prior Publication Data

US 2017/0083651 A1   Mar. 23, 2017

Related U.S. Application Data

(60) Provisional application No. 62/220,505, filed on Sep. 18, 2015.

(51) Int. Cl.
*G06F 17/00* (2006.01)
*G06F 17/50* (2006.01)

(52) U.S. Cl.
CPC ........ *G06F 17/5036* (2013.01); *G06F 17/504* (2013.01)

(58) Field of Classification Search
USPC ......................................................... 716/107
See application file for complete search history.

(56) References Cited

U.S. PATENT DOCUMENTS

| | | | |
|---|---|---|---|
| 8,122,402 B2* | 2/2012 | Tanimoto | G06F 17/504 716/101 |
| 8,429,581 B2 | 4/2013 | Boehm | |
| 2009/0228849 A1* | 9/2009 | Mossawir | G06F 17/504 716/106 |
| 2009/0241074 A1* | 9/2009 | Tanimoto | G06F 17/504 716/103 |
| 2013/0055174 A1 | 2/2013 | Boehm | |
| 2013/0227505 A1* | 8/2013 | Tanimoto | G06F 17/504 716/107 |
| 2015/0178428 A1* | 6/2015 | Anand | G06F 17/5036 703/13 |
| 2017/0083651 A1* | 3/2017 | Akkaraju | G06F 17/5036 |

* cited by examiner

*Primary Examiner* — Mohammed Alam
(74) *Attorney, Agent, or Firm* — Alston & Bird LLP

(57) ABSTRACT

Techniques for equivalence checking of analog models are disclosed. The models include transistor level representations. The representations are used for simulation and verification of the circuit and are required to give similar output results in response to a given input stimulus. A common input stimulus is created for a first representation and a second representation of a semiconductor circuit. Output waveforms are generated for the first representation and the second representation using the common input stimulus. The first output waveforms and the second output waveforms are checked for equivalence. Signals from the first output waveforms are mapped to the second output waveforms.

23 Claims, 17 Drawing Sheets

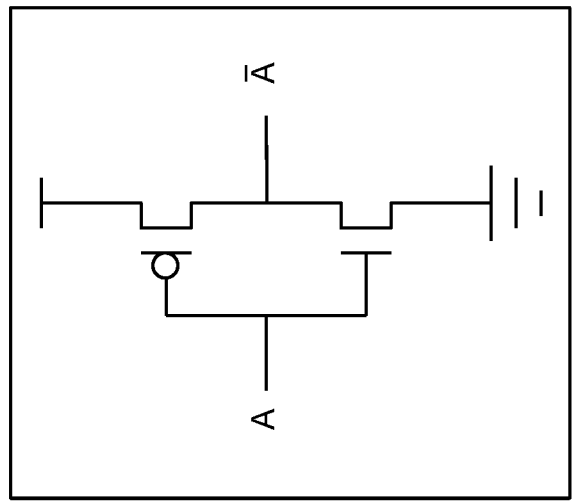
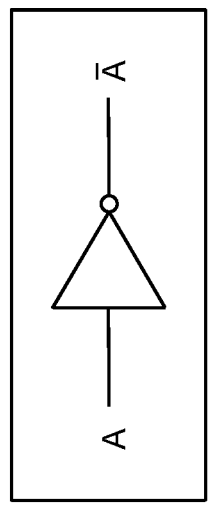
FIG. 3

```
.inc 'cmos35.mod'
.subckt inva zn i
mn1 zn1 i gnd gnd n w=5.00u l=0.35u
mp1 zn1 i vdd vdd p w=10.00u l=0.35u
x1 zn1 zn invb
x2 zn1 zn invr
.ends
.subckt invb i zn
mn1 zn i gnd gnd n w=20.00u l=0.35u
mp1 zn i vdd vdd p w=40.00u l=0.35u
.ends
.subckt invr i zn
mn1 zn i gnd gnd n w=1.00u l=0.35u
mp1 zn i vdd vdd p w=2.00u l=0.35u
.ends
.global vdd gnd
vsu vdd gnd 3.3
.print v(*)
.end
```

FIG. 6

```
`timescale 1ps/1ps module sv_ana_model(i_in, v_in, i_out, v_out);
input i_in;
input v_in;
output i_out;
output v_out;
real i_in;
real i_out;
real v_in;
real v_out;

real v = 3.3;
real v1 = 3.2999;
real i = 7.7;
real i1 = 7.6999;

assign v_out = v + v_in - v1;
assign i_out = i + i_in -i1;
endmodule

Input stimulus
real v = 3.3;
real v1 = 3.2999;
real i = 7.7;
real i1 = 7.6999;

endmodule
```

FIG. 7

```
[analog_fsdb] time_unit    = ps
[analog_fsdb] begin_time   = 0.000000
[analog_fsdb] end_time     = 190000.000000
[analog_fsdb] cycle        = 200.000000
[analog_fsdb] shift        = 5.000000
[analog_fsdb] tolerance    = 0.200000
[analog_fsdb] max error    = 10
[analog_fsdb] ----------------------------------------
0) FSDB1: testbench
   FSDB2: ana_model
-> Compare Diff:: (1620000 x 10.000000fs, 0.248961) vs. (1620500 x 10.000000fs, 0.105093) : Diff = -0.143868
-> Compare Diff:: (1960000 x 10.000000fs, 0.814990) vs. (1960500 x 10.000000fs, 0.564766) : Diff = -0.250224
-> Compare Diff:: (2020000 x 10.000000fs, 0.058017) vs. (2020500 x 10.000000fs, 0.217675) : Diff = 0.159658
-> Compare Diff:: (3080000 x 10.000000fs, 0.599412) vs. (3080500 x 10.000000fs, 0.795527) : Diff = 0.196115
-> Compare Diff:: (3880000 x 10.000000fs, 0.805777) vs. (3880500 x 10.000000fs, 0.938173) : Diff = 0.132396
-> Compare Diff:: (4760000 x 10.000000fs, 1.164004) vs. (4760500 x 10.000000fs, 0.991997) : Diff = -0.103994
-> Compare Diff:: (5540000 x 10.000000fs, 1.204487) vs. (5540500 x 10.000000fs, 1.058304) : Diff = -0.146184
-> Compare Diff:: (6040000 x 10.000000fs, 1.127229) vs. (6040500 x 10.000000fs, 0.921785) : Diff = -0.245132
-> Compare Diff:: (6340000 x 10.000000fs, 1.165796) vs. (6340500 x 10.000000fs, 0.980789) : Diff = -0.185007
-> Compare Diff:: (6740000 x 10.000000fs, 1.202600) vs. (6740500 x 10.000000fs, 1.061145) : Diff = -0.141455
```

FIG. 9

```
[analog_fsdb] time_unit    = ps
[analog_fsdb] begin_time   = 0.000000
[analog_fsdb] end_time     = 190000.000000
[analog_fsdb] cycle        = 200.000000
[analog_fsdb] shift        = 5.000000
[analog_fsdb] tolerance    = 0.200000
[analog_fsdb] max error    = 10

0) FSDB1: testbench
    FSDB2: ana_model
    -> Compare Diff: (1620000 x 10.000000fs, 0.248961) vs. (1620500 x 10.000000fs, 0.105093) : Diff = -0.143868
    -> Compare Diff: (1960000 x 10.000000fs, 0.814990) vs. (1960500 x 10.000000fs, 0.623764) : Diff = -0.191226
    -> Compare Diff: (2020000 x 10.000000fs, 0.058017) vs. (2020500 x 10.000000fs, 0.217675) : Diff =  0.159658
    -> Compare Diff: (3080000 x 10.000000fs, 0.599412) vs. (3080500 x 10.000000fs, 0.795527) : Diff =  0.196115
    -> Compare Diff: (3880000 x 10.000000fs, 0.805777) vs. (3880500 x 10.000000fs, 0.938173) : Diff =  0.132396
    -> Compare Diff: (4760000 x 10.000000fs, 1.164004) vs. (4760500 x 10.000000fs, 0.991997) : Diff = -0.103994
    -> Compare Diff: (5540000 x 10.000000fs, 1.204487) vs. (5540500 x 10.000000fs, 1.058304) : Diff = -0.146184
    -> Compare Diff: (6040000 x 10.000000fs, 1.127229) vs. (6040500 x 10.000000fs, 0.951117) : Diff = -0.176112
    -> Compare Diff: (6340000 x 10.000000fs, 1.165796) vs. (6340500 x 10.000000fs, 0.980789) : Diff = -0.185007
    -> Compare Diff: (6740000 x 10.000000fs, 1.202600) vs. (6740500 x 10.000000fs, 1.061145) : Diff = -0.141455
```

FIG. 10

EQUIVALENCE CHECKING OF ANALOG MODELS

RELATED APPLICATIONS

This application claims the benefit of U.S. provisional patent applications "Equivalence Checking of Analog Models" Ser. No. 62/220,505, filed Sep. 18, 2015. The foregoing application is hereby incorporated by reference in its entirety.

FIELD OF ART

This application relates generally to design analysis and more particularly to equivalence checking of analog models.

BACKGROUND

Semiconductor integrated circuits or chips are ubiquitous in nearly every modern product. Whether used for a smart phone, a television, a washing machine, or another common or specialty product, chips are used for control, communication, networking, safety, and other functions that range anywhere from very basic to intricate and complex. Regardless of the application, the development cycle, which is the time from design to commercial availability of a product, is important for any business or government entity. In competitive areas such as consumer electronics, reducing the development cycle can make the difference between a successful product, versus a product that arrives on the market too late to be a competitive product.

Because of the intricacy of the chips used in these and other products, modeling and simulation techniques are repeatedly applied to the circuit designs throughout the design processes. The models that are generated for the designs describe the chips at various levels of design abstraction. The levels of abstraction, while arbitrary, are used to describe the circuit at varied levels of detail, from wiring lists or netlists, to logical connections, to structure, and to behavior, among many others. The levels of abstraction are used to control the complexity of the designs as the designs are modeled and simulated. In some cases, simulation can reduce or even eliminate the need for extensive prototyping of circuits. Thus simulation can reduce development time required to get a product to market, as well as reducing development costs by finding design issues earlier in the product development process.

Netlists and wiring lists provide a description of the connectivity of an electronic circuit. The netlist can include a list of terminals/pins of the electronic components in a circuit, as well as a list of the electrical connections that interconnect the terminals. The different types of circuits that can be represented by netlists include analog, digital, and mixed-signal. The mixed-signal circuits comprise both analog and digital portions that are coupled to each other.

Simulations can vary in sophistication from pure logical simulation that assumes an ideal case in terms of switching times and propagation delays, to a complex simulation that accounts for various device parameters such as gate widths, semiconductor material characteristics, ambient conditions, and the like. Hardware Description Language (HDL) is a language that can be used to describe the structure and behavior of an electronic circuit, and is particularly useful for digital logic circuits. HDL provides a temporal dimension to simulate the behavior or state of circuits as a function of time. Libraries including basic circuits, standard cells, and the like can be combined to make highly complex circuits. Simulation can be part of an Electronic Design Automation (EDA) toolchain and process. It enables designers to try various combinations of circuits without the expense of actual fabrication. At the transistor level, various parameters such as device width, voltage thresholds, and transition times can be included in the simulation. These tools enable reduced development cost and time that is essential given the competitive nature of today's electronics industry.

SUMMARY

Disclosed embodiments provide for the improvement of modeling and simulation of analog and mixed-signal circuits by matching the output responses of two different representations of the same circuit to a given input stimulus. Early in the design of a semiconductor circuit or chip, "high level" models and descriptions are available that describe the architecture and behavior of the chip but lack the operational details of the circuits that are required to verify proper operation. When detailed "low level" circuit models and descriptions of the circuit become available, then the high level models and the low level models are executed and their model outputs are compared. A common input stimulus is generated for both a first representation and a second representation of a semiconductor circuit. First output waveforms are generated for outputs of the first representation and second output waveforms are generated for outputs of the second representation of the semiconductor circuit. The outputs of both the first and second representations are generated using the common input stimulus. Equivalence checking is performed between the first output waveforms and the second output waveforms.

Various features, aspects, and advantages of various embodiments will become more apparent from the following further description.

BRIEF DESCRIPTION OF THE DRAWINGS

The teachings of the present concept can be readily understood by considering the following detailed description in conjunction with the accompanying drawings.

FIG. 3 illustrates an inverter logic symbol and schematic diagram.

FIG. 6 is an example SPICE™ netlist for a buffer circuit.

FIG. 7 is an example Verilog™ netlist for a buffer circuit.

FIG. 9 illustrates comparison of analysis results that fail.

FIG. 10 illustrates comparison of analysis results that pass.

DETAILED DESCRIPTION

Figure 1:
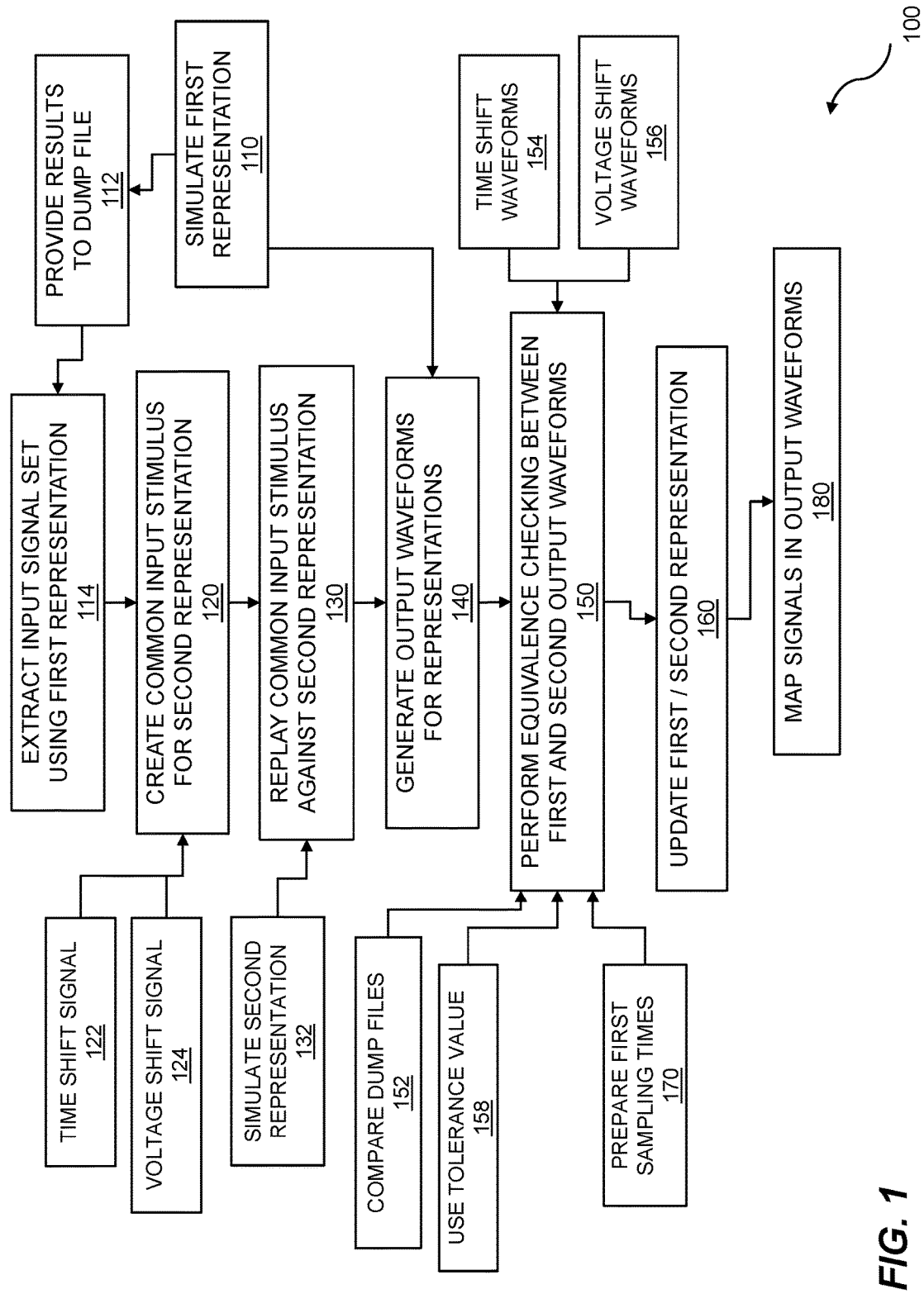
FIG. 1 is a flow diagram for equivalence checking of mixed models.

Concepts are disclosed for design analysis and modeling. The ever-increasing design complexity of integrated circuits makes design verification, validation, and other critical tasks exceedingly difficult. In order to accomplish design goals, the many design criteria and their divergent requirements of an electronic system must be balanced. To address the problem of design complexity, multiple representations of a given design are used at various stages of the design process. The descriptions, which can be considered levels of design abstraction, can take a high level approach and address behavioral and structural behavioral requirements of the design. At the lower end of the complexity spectrum, logical and transistor level representations can be used. At some point in the design process, any one of these design representations can be particularly useful or, in fact, critical to one or more design steps. Since the various representations of the design are typically generated at different points in the design process, and since the representations can be generated independently of one another, it is critical that the design representations be evaluated for equivalency. That is, the simulation results generated by each of the design representations must be "equivalent" in order to be credible and useful.

Verification of circuits, including the interface between analog and digital blocks, is a major challenge as accurate SPICE™ netlists are not available until much later in the design cycle. This delayed availability creates a bottleneck in schedule as the digital logic has input coming from the analog portion of the chip. Specifically, functional verification is compromised unless accurate analog signals are available.

Flows have consisted of using "Verilog™ only" models to represent analog circuits in the initial phase. However, the increasing complexity and high number of interactions between the analog and digital portions of the design expose many regions of functional coverage that can be hit only in mixed signal mode (e.g. SPICE™ plus Verilog™). Even when the analog circuit's SPICE™ netlist is available, there is the challenge of lengthy simulation run times. This results in only a small sub-set of tests within a regression being run in mixed mode during the pre-silicon verification stage.

As designs increase in complexity, limitations have an exponentially larger impact on schedules. Therefore both options, specifically the less accurate "SystemVerilog™ only" and highly accurate "SystemVerilog™ plus SPICE™" flows cannot meet the needs of comprehensive chip verification. A middle ground must exist in which the scope and accuracy of analog circuit representation is not compromised, but full functional verification of digital logic is still accomplished. In the disclosed concepts, the accuracy needs of analog circuit representation is addressed by using a topology of the model accuracy and equivalence checking flow that is based on the premise that two different representations of the same analog circuit, when given the exact same input stimulus, will have a matching output. That is, a SPICE™ netlist and the second implementation, a SystemVerilog™ model, should produce the same output.

Both of the implementations have the same original design specification as the basis for development. In the initial phase of the design cycle, the simulations and the engineering associated with the design methodology of both implementations use input stimulus that are unique to their flows in order to measure accuracy of the model based on the "real" construct with that of the actual circuit. Therefore, a common input stimulus is only used after both implementations have certain code stability and maturity. Once the common input stimulus has been created, the respective simulation environment (e.g. SPICE™ and SystemVerilog™) is re-used to generate separate waveform dump files. These files form the basis of the equivalence checking and generate a report that can be visualized.

FIG. 1 is a flow diagram for equivalence checking of mixed models. The flow 100 describes a computer-implemented method for design analysis. The design analysis can be for semiconductor circuits that contain analog portions, digital portions, and/or mixed signal portions. The semiconductor circuit can be an analog circuit. The analog circuit can be any appropriate analog circuit including a voltage comparator, an amplifier, an integrator, and so on. The semiconductor circuit can be a mixed signal circuit. Modules of the semiconductor circuit can include analog functions, digital functions, hybrid functions, and so on.

The flow 100 includes simulating a first representation 110. In embodiments, the first representation is a transistor-level representation such as a Spice™ representation or similar circuit simulation representation. The first representation can correspond to a transistor level netlist. The transistor level can include bipolar devices, MOS devices, and so on. The first representation can correspond to a Spice™ netlist. Any appropriate circuit simulator netlist, input file, etc., can be used. The common input stimulus can include values, signals, and any other appropriate signal. The common input stimulus can include a continuous waveform. Similarly, the common input can include a step, an impulse, discrete values, and so on. The input stimulus can be applied to both representations for simulation and other purposes. The flow continues with providing simulation results to a first dump file 112. In embodiments, the dump file can be a text-based dump file, such as a comma separated value (CSV) dump file containing entries of time, along with a corresponding voltage, current, and/or frequency. In some embodiments, the dump file can be in a binary format. The flow continues with extracting an input signal set using the first representation 114. The first representation can be the input to the transistor-level simulation. The flow continues with creating a common input stimulus for the second representation 120. The creation of a common input stimulus can include obtaining a simulation deck for a representation, simulating the simulation deck, and extracting input stimulus vectors. The common input stimulus can be used when two or more representations of a semiconductor circuit have been created. Thus, embodiments can include extracting the input signal set from the first representation of the semiconductor circuit based on simulating the first representation and providing results of the simulating the first representation to a first signal dump file.

The second representation can be a Hardware Description Language (HDL) representation. In embodiments, the first and/or second representation can include a netlist, where the netlist can be based on Spice™, Verilog™, SystemVerilog™, SystemC™, VHDL, and so on. The second representation can correspond to a logical netlist. Any appropriate representation of a logical netlist can be used. The second representation can correspond to a structural netlist. That is, the second representation can describe how various logical elements that can make up the design can be coupled together in order to realize the design. Thus, in embodiments, the second representation of the semiconductor circuit includes structural modeling. Other abstract levels can be used for the second representation. The second representation can correspond to a behavioral netlist. Any appropriate level of abstraction can be used for the first and the second representations. Any appropriate EDA language or another coding language can be used for the first and the second representations. The second representation can correspond to a Verilog™, a SystemVerilog™, a SystemC™, a VHDL, or any other appropriate netlist. The roles and requirements of the first representation and the second representation can be arbitrarily assigned. In embodiments, the first representation corresponds to a behavioral netlist. The behavioral netlist can describe the functions and tasks performed by the design rather than how the various components of the design are coupled together. The second representation can correspond to a transistor level netlist. The second representation can describe how the various terminals of bipolar and MOS transistors and other active and passive devices can be coupled together in order to implement the design. Due to the techniques used to design the semiconductor circuit, the various representations of the chip might not be available simultaneously. In embodiments, the second representation is only available later in a design cycle than the first representation of the semiconductor circuit. For example, a behavioral description of the semiconductor circuit can be available early in the design process to describe what the circuit will do, and the transistor level description might not be available until more detail about the logic family, available technology, and other design decisions have been made. Thus, in embodiments the second representation of the semiconductor circuit includes behavioral modeling.

The flow can include time shifting an input signal 122. This allows the portion of the waveform that is of interest to be input to the representations at the start of the simulation. For example, if there are several seconds of "dead time" before the active waveform starts, the signal can be time shifted so that the "dead time" is not included for the representations. Thus, in embodiments creating the common input stimulus signal set for the second representation includes time shifting the input signal set extracted using the first representation of a semiconductor circuit. The flow can include voltage shifting a signal 124. This is particularly useful if a signal goes slightly negative. In some cases, if the lowest theoretical value of a signal is zero volts, but the input waveform has a minimum value that is negative, it can sometimes skew the results of simulations. The voltage shifting can alleviate this condition. Thus, in embodiments creating the common input stimulus signal set for the second representation includes voltage shifting the input signal set extracted from the first representation of a semiconductor circuit. The flow 100 includes simulating a second representation 132. In embodiments, the second representation is an HDL representation such as a SystemVerilog™ representation or similar circuit simulation representation. The flow continues with replaying the common input stimulus against the second representation 130. Thus, the common input stimulus allows the same input to be fed to both the first and second representations. The flow continues with generating output waveforms for both representations 140. The output waveforms can be continuous waveforms, discrete waveforms, and so on. The flow then continues with performing equivalence checking between the first and second output waveforms 150. The comparison of the first and second output waveforms can include comparing dump files 152. Thus, a first dump file can represent the output waveform of the first representation, and a second dump file can represent the output waveform of the second representation. In some embodiments, a compare file can be generated based on the difference of the first and second dump files. The flow can include using a tolerance value 158. Thus, when the first output waveform and second output waveform are compared, they do not necessarily need to be an "exact match." The tolerance value allows waveforms that are similar, but not identical, to be considered as a match for the purposes of equivalence checking. The flow can include time shifting waveforms 154. This can include time shifting the output waveforms of one or both representations so that the comparison between them can be more accurately performed. The flow can include voltage shifting waveforms 156. This can include voltage shifting the output waveforms of one or both representations so that the comparison between them can be more accurately performed. Thus embodiments include time shifting the first output waveforms or the second output waveforms as part of the performing equivalence checking. Thus, embodiments include voltage shifting the first output waveforms or the second output waveforms as part of the performing equivalence checking. The flow can include preparing first sampling times 170. This includes the sampling of the first output waveform. In embodiments, the sampling can be the same for the first output waveform and the second output waveform. In other embodiments, the first output waveform and the second output waveform can be sampled at different times. Based on the results of the equivalence checking in 150, the first and/or second representation is updated 160. The flow continues with mapping signals in output waveforms 180. The mapping provides an association between the first output signal and the second output signal. Thus, embodiments include mapping signals from the first output waveforms to signals from the second output waveforms.

An output simulation waveform dump file can be created for either the Spice™ netlist or the behavioral model (whichever is available earlier in the design cycle). In the next step, the input stimulus vectors can be extracted from the Spice™ dump file. In the third and final step, the input vectors can be re-run on the design representation that can be available later in the design cycle. In this way, both the representations can be guaranteed to have the same input stimulus. The above steps are independent of which design representation is available first, thus ensuring equivalence of input vectors during simulations for both analog and digital design portions as they progress in parallel. Thus, in embodiments the semiconductor circuit is an analog circuit. In other embodiments, the semiconductor circuit is a mixed signal circuit.

Input stimulus is the data that a circuit receives (as a signal) for further processing. This processing can involve extracting useful data for the next stage of the system or increasing the strength of the signal (i.e. amplification) or filtering the signal from noise that is not useful for the purpose of the system. Additionally, the input stimulus triggers several steps within the circuit towards generating the final output. The combination of the processing and the triggering are the two main components of the input stimulus.

The purpose of the input stimulus is to test the circuit, when it is used outside the controlled engineering environment. Since the number of potential combinations for these input signals can be very high, it is important that the circuit be robust enough to handle all of the real world scenarios. Specifically, there should be a way in the development stage to recreate as many of those scenarios as possible to detect a defect in the circuit. A defect is defined as an implementation which prevents the circuit from being able to properly handle an input, thereby generating an output that is not expected. In summary, input stimulus is data traffic that is sent into the circuit design to verify that the circuit is implemented as expected and there are no problems in the functionality. Ideally input stimulus should come close to mimicking what will happen when the circuit is performing outside the development environment.

For the Verilog™ representation of the circuit (i.e. a digital representation), the input stimulus is created using a testbench. A testbench can include a combination of blocks of HDL code, where one sub-block is the main design (i.e. the circuit) and there is a sub-set of blocks that are the source of input signals. These sources are connected to the input interface of the design and the input signals are transmitted through that connection. There is another set of sub-blocks which are connected to the output portion of the design to collect responses and also check to see if the responses are accurate. The input sub-blocks also provide the trigger signal to ensure that the main circuit is ready to receive the input signals.

These input signals are generated inside the sub-blocks using a combination of mathematical operations (e.g. +, −, /, and *) on numbers that are randomly chosen. The output of these operations represent the signal that then will be transmitted through the connections previously described. The transmission itself needs to follow certain rules on when signals can be transmitted (i.e. delays). By repeating the above-mentioned mathematical operations in various combinations, a large series of random input stimuli can be created, so a thorough combination of inputs can be generated. In summary the implementation of blocks that provide input stimulus should consist of a trigger signal to the design followed by generation of data traffic that is random and diverse enough to mimic the real world under which the design will operate. Once the common input stimulus has been created, the respective simulation environment (e.g. Spice™ and SystemVerilog™) is re-used to generate separate waveform dump files. These files form the basis of the equivalence checking with a report generated that can be visualized. Thus, embodiments include a computer-implemented method for design analysis comprising extracting an input signal set using a first representation of a semiconductor circuit; creating a common input stimulus signal set for a second representation of the semiconductor circuit based on the input signal set extracted from the first representation of the semiconductor circuit; replaying the common input stimulus signal set against the second representation of the semiconductor circuit; generating first output waveforms for outputs of the first representation and second output waveforms for outputs of the second representation of the semiconductor circuit using the common input stimulus; and performing equivalence checking between the first output waveforms and the second output waveforms. In embodiments, the common input stimulus signal set comprises a continuous waveform. Embodiments include preparing first sampling times for the first output waveforms; preparing second sampling times for the second output waveforms; generating a vector of comparison objects, wherein the vector of comparison objects includes objects in both the first output waveforms and the second output waveforms; and determining a deviation between a first object in the first output waveforms and a second object in the second output waveforms wherein the deviation exceeds a tolerance value. Various steps in the flow 100 may be changed in order, repeated, omitted, or the like without departing from the disclosed concepts. Various embodiments of the flow 100 can be included in a computer program product embodied in a non-transitory computer readable medium that includes code executable by one or more processors.

Figure 2:
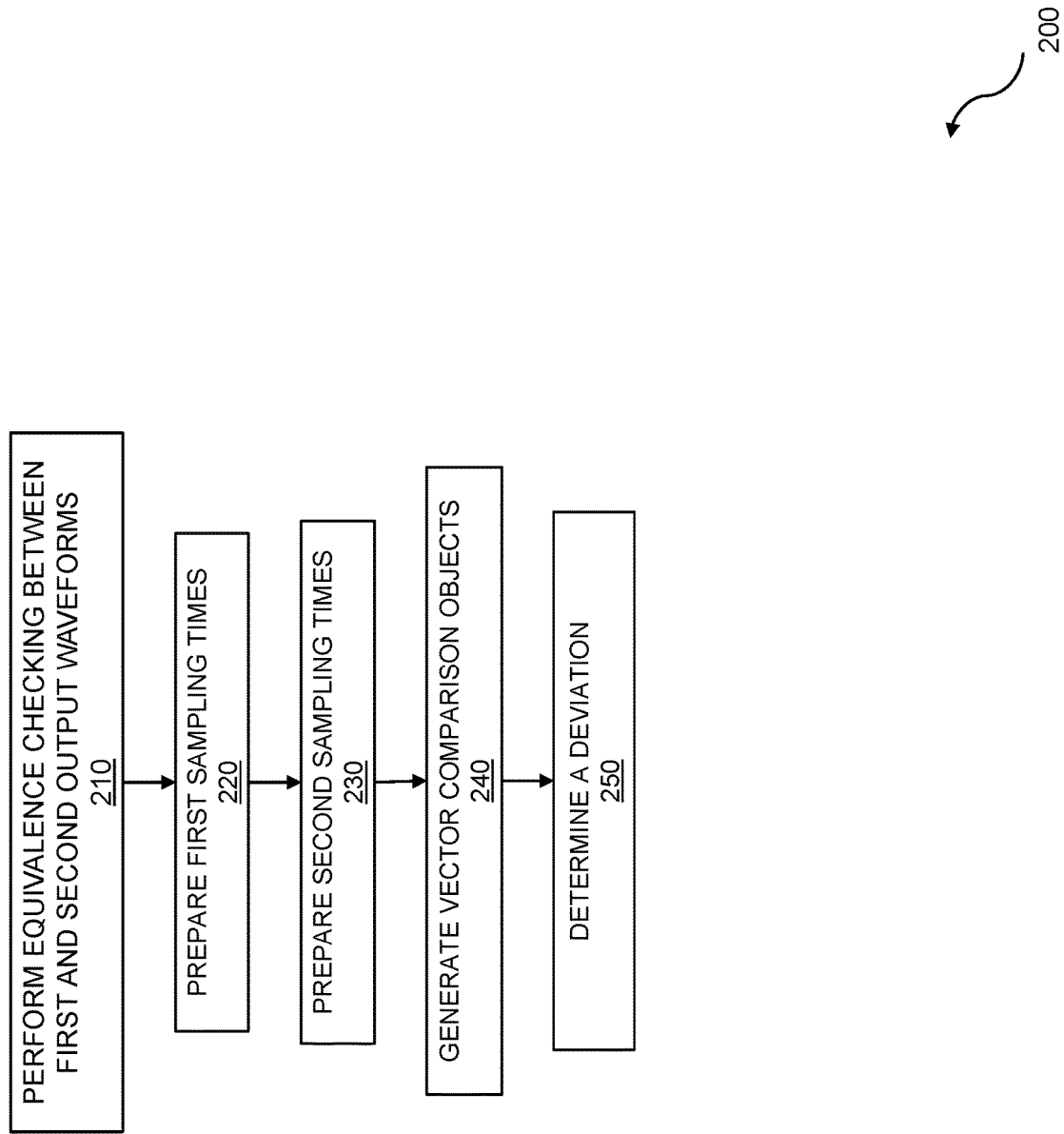
FIG. 2 is a flow diagram for deviation determination.

FIG. 2 is a flow for deviation determination. The flow 200 starts with performing equivalence checking between first and second output waveforms 210. The flow continues with preparing first sampling times 220. The first sampling times are points in time where the first output waveform is sampled. The flow continues with preparing second sampling times 230. The second sampling times are points in time where the second output waveform is sampled. In some embodiments, the first sampling times can be equal to the second sampling times. In some embodiments, at least one of the first sampling times can be different than the second sampling times. The flow continues with generating vector comparison objects 240. Each set of sample points for a given waveform can be represented as an N-dimensional vector. The N-dimensional vector can be thought of as an array of tuples, where each tuple contains at least two items, where one of the items is time. For example, a vector of 5 sample points for the voltage of an output waveform can be represented as

[0, 0.1]
[1, 0.3]
[2, 0.9]
[3, 1.2]
[4, 1.2]

Where the first value represents a time and the second value represents a voltage. In embodiments, the units of time can be specified a priori by the analysis tools. For example, the time units can be in picoseconds, nanoseconds, or microseconds. In some embodiments, the vectors can have more than two dimensions. For example, other parameters such as current and frequency can be included in the vector. The flow continues with determining a deviation 250. That is, a deviation is determined between a first vector comparison object (VCO) corresponding to the first output waveform, and a second VCO corresponding to the second output waveform. In embodiments, the deviation determination is performed via a root mean square (RMS) process. In some embodiments, the deviation determination is performed by computing a first average value of the VCOs from the first output waveform and a second average value of VCOs from the second output waveform, and comparing the difference between the first average value and the second average value. In some embodiments, the deviation determination is performed by computing a first median value of the VCOs from the first output waveform and a second median value of the VCOs from the second output waveform, and comparing the difference between the first median value and the second median value. In some embodiments, the deviation determination is performed by computing a first variance value of the VCOs from the first output waveform and a second variance value of the VCOs from the second output waveform, and comparing the difference between the first variance value and the second variance value. In some embodiments, a score can be computed to indicate a degree of equivalence between the two waveforms. In one embodiment, the score S is computed as:

$$S = \text{SUM}(k1(Di)) + k2(R)$$

Where k1 and k2 are constants, Di represents the ith difference value, and R is the number of data points outside of the predetermined tolerance. Thus, a lower value for the score S indicates a greater similarity between the two output waveforms. If there are many difference values outside of the predetermined tolerance value/range, and/or there are large differences, then the score S increases, indicating less similarity between the two output waveforms. Other deviation determination techniques can be used. Various steps in the flow 200 may be changed in order, repeated, omitted, or the like without departing from the disclosed concepts. Various embodiments of the flow 200 can be included in a computer program product embodied in a non-transitory computer readable medium that includes code executable by one or more processors.

FIG. 3 illustrates an inverter logic symbol and schematic diagram. An inverter or NOT circuit, or any other logic circuit, can be represented by a logic symbol 300, a schematic diagram 302, a segment of code, a segment of electronic design automation (EDA) code, a simulation description such as a SPICE™ deck, and so on. The inverter schematic logic symbol 300 shows that for an input A, the inverter produces an output NOT(A), also called the inverse of A. The schematic diagram 302 shows a transistor level diagram for an inverter. While the inverter shown is based on a CMOS logic family, any appropriate logic family can be used. When an input A is applied to the inverter shown in diagram 302, NOT(A) is generated at the output.

Figure 4:
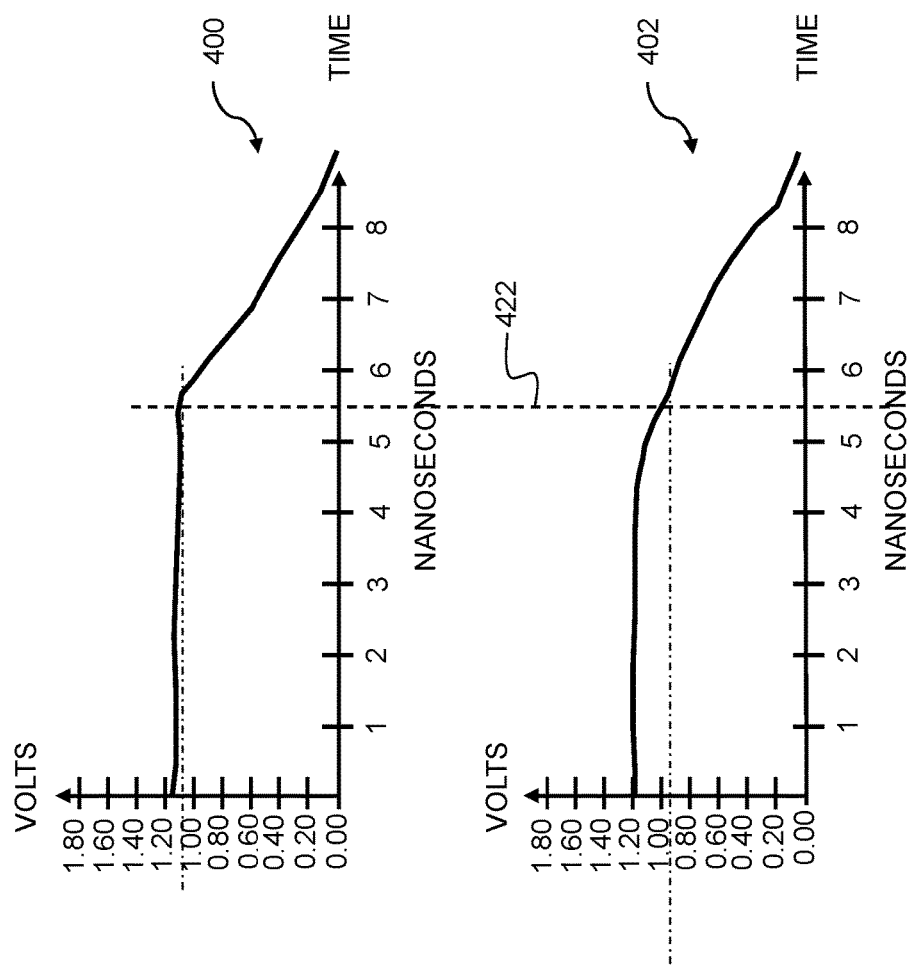
FIG. 4 illustrates waveforms for an inverter.

FIG. 4 illustrates waveforms for an inverter. In embodiments, waveform 400 is a first output waveform, and waveform 402 is a second output waveform. The waveform 400 and waveform 402 can be compared by examining the voltage at a given time 422. As is indicated in FIG. 4, the voltage of the first waveform 400 at time 422 is about 1.05 volts, while the voltage of the second waveform 402 is about 0.95 volts. Depending on a predetermined threshold, the waveforms 400 and 402 can be deemed equivalent. For example, if a tolerance threshold is established at 0.2 volts, then the first waveform 400 and the second waveform 402 can be deemed equivalent since 1.05−0.95<0.2, thus the difference between the waveforms at time 422 is less than the predetermined threshold. If the tolerance threshold is established at 0.08 volts, then the first waveform 400 and the second waveform 402 can be deemed as nonequivalent since 1.05−0.95>0.8

Figure 5:
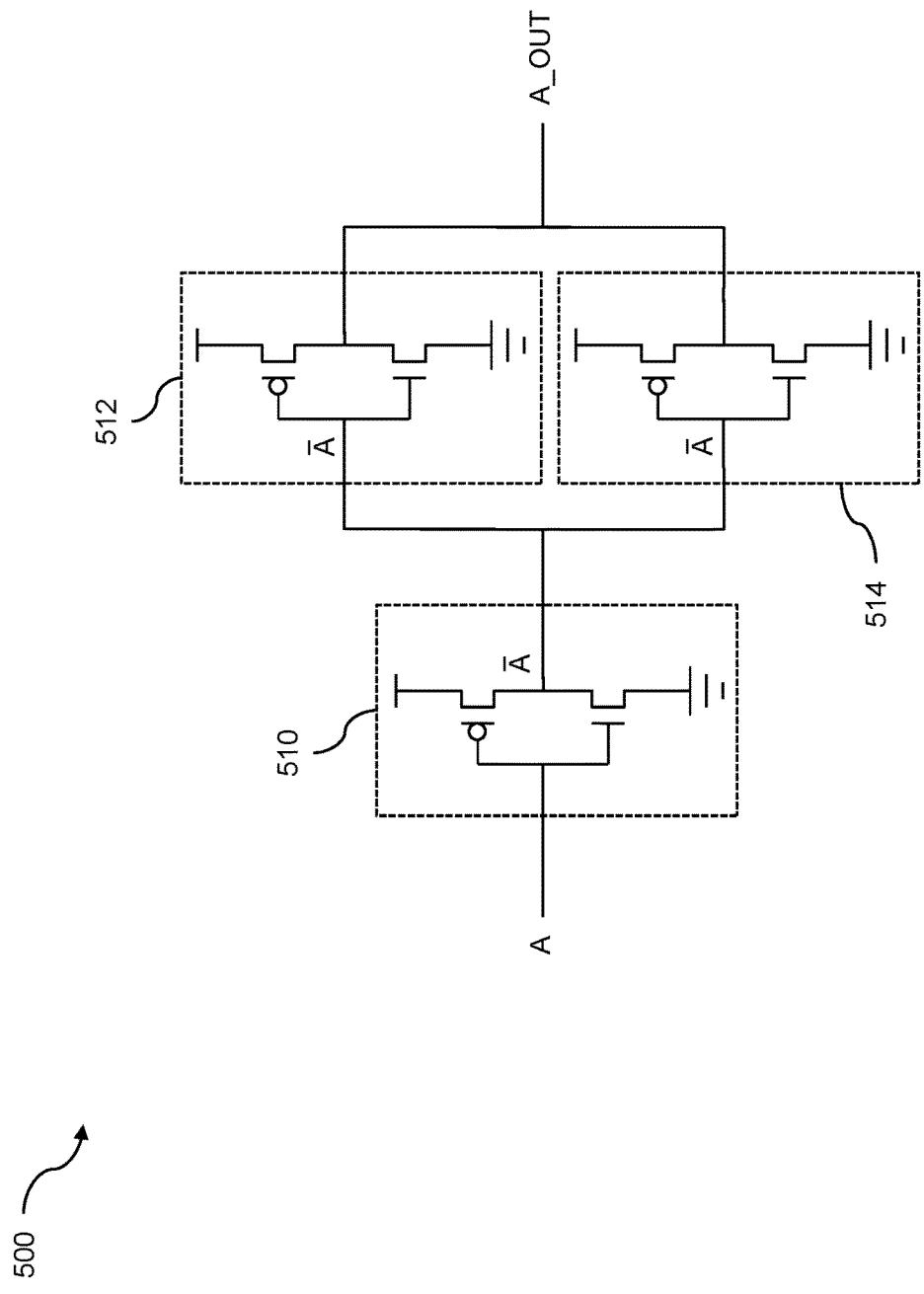
FIG. 5 illustrates a two times buffer using invertors.

FIG. 5 illustrates a two times buffer using inverters. Circuit 500 comprises a first inverter 510. The output of the first inverter 510 is input to inverter 512 and inverter 514, and the output A_OUT originates from both inverters 512 and 514. A circuit such as that shown in FIG. 5 can be modeled by HDL, as well as at a transistor level (using SPICE, or a similar modeling program).

FIG. 6 is an example SPICE™ netlist for a buffer circuit. A buffer and any other logic gate, logic module, logic system, and so on, can be described by a segment of code, a netlist etc., that can be executed by a circuit simulator. A netlist 600 for a buffer can be written for a SPICE™ electronic circuit simulator. The buffer that is described by the netlist can be based on any appropriate logic circuit family including logic families based on bipolar transistor technologies, MOS transistor technologies, and so on. An appropriate set of inputs can be selected for the netlist and the SPICE™ simulator can be used to execute the netlist with the set of inputs. The SPICE™ simulator can generate a set of outputs based on the inputs and the netlist. The outputs can be rendered on a display, stored in a file, or maintained in another way.

FIG. 7 is an example Verilog™ netlist for a buffer. As was the case for a SPICE™ description of a logic gate, a buffer and any other logic gate, logic module, logic system, etc., can be described by a segment of code that can be written in a hardware description language (HDL) such as Verilog™, SystemVerilog™, SystemC™, VHDL, and so on. A segment of code can be created to represent a Verilog™ netlist 700 for an inverter. Similarly, a Verilog™ netlist can be created to represent any other logic gate. An appropriate input or plurality of inputs can be selected for the netlist 700, and the Verilog™ simulator can be used to simulate the code. The simulator can be used to generate a set of outputs based on the netlist and the set of inputs. The outputs of the simulation can be rendered on a display, stored in a file, or retained and displayed by other techniques.

Figure 8:
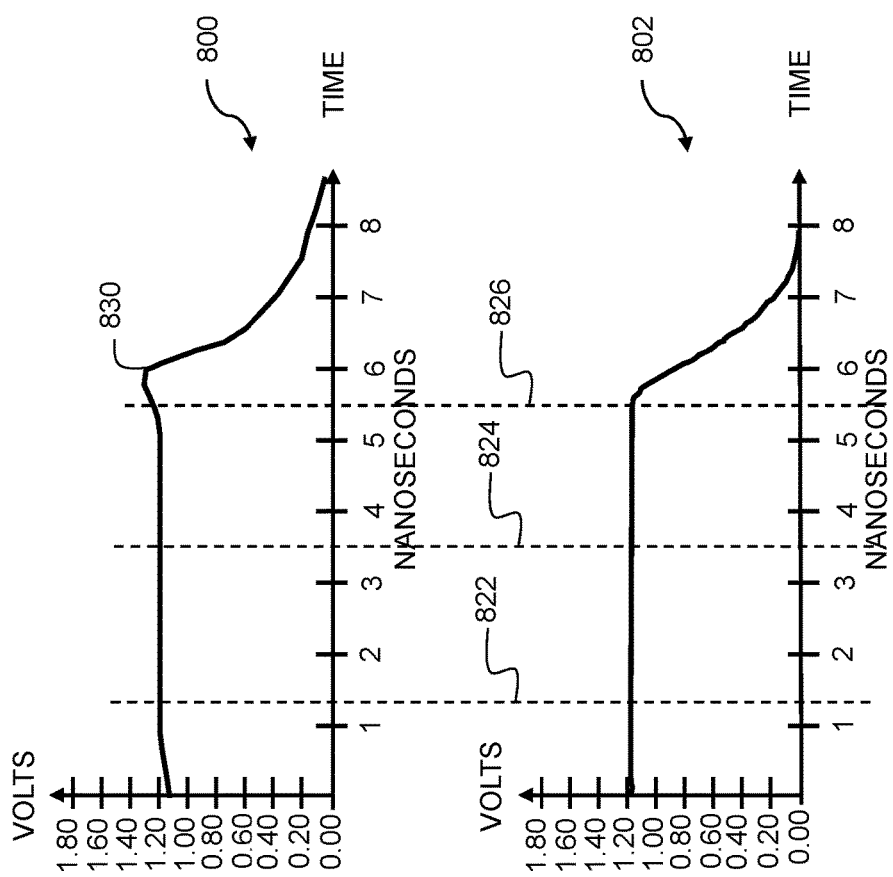
FIG. 8 illustrates waveforms for a buffer circuit.

FIG. 8 illustrates waveforms for a buffer circuit. One or more descriptions, netlists, etc., can be created to describe a logic gate, module, subsystem, system, and so on. The netlists, for example, can be simulated and the results of the simulations can be rendered on a display, stored in a file, and so on. Waveforms 800 and 802 can be rendered based on simulations of two or more representations of a logic circuit. The rendered simulation results can be compared. The comparing of the simulation results can be used to determine whether the various representations of a given logic gate, for example, produce simulation results that are similar. The degree of similarity between and among the simulation results can be based on a percentage, a threshold, and so on. The comparing of the simulation results can be used to determine equivalence of the representations and models. The models can include digital models, analog models, mixed-signal models, hybrid models, and so on. In embodiments, waveform 800 is from a transistor level simulation, and waveform 802 is from a logical level simulation. Thus, in embodiments, the first representation of the semiconductor circuit includes transistor level modeling. In embodiments, the transistor level simulation can be a SPICE simulation. In embodiments, the logical level simulation can be based on Verilog™, SystemVerilog™, SystemC™, VHDL, or the like. In this example, three points in time are defined, indicated as 822, 824, and 826. At each of these points, the voltage level of the waveform 800 and the waveform 802 are evaluated. A vector of comparison objects can be created for each waveform. The vector of comparison objects can include a comparison object for each of the three points in time indicated as 822, 824, and 826, where each comparison object includes a corresponding voltage at each time.

Waveform 800 includes a peak 830. In some embodiments, such peaks can occur in the output of the transistor level simulation. In some embodiments, peak smoothing can be performed on the output of the transistor level simulation prior to comparison. In embodiments, a moving window average filter is used to smooth peaks prior to comparison.

FIG. 9 illustrates comparison of analysis results that fail. Two or more representations of a logic circuit can be generated and simulated, and the simulation results can be compared. The comparison analysis results 900 can be based on a percentage, on a threshold, on error bars, on minimum and maximum values, or any other appropriate comparison technique. The comparison analysis can be used to determine equivalence of two representations of a circuit, for example. The equivalence of two representations can be performed at various points throughout a design process for an electronic system, for example. The equivalence of two representations can be used for verification, validation, and other design purposes. The comparison can be for mismatches. The comparison analysis results 900 can be captured in a log file. The log file can be updated when the differences between values of the signals in the dump files can exceed the given "tolerance level". Similarly, the log file can be updated when the signals match or are within the acceptable tolerance level. Thus, in embodiments, the performing equivalence checking includes evaluating using a tolerance value. In embodiments, the tolerance value includes a time tolerance. In embodiments, the tolerance value includes a voltage tolerance. In embodiments, the tolerance value includes a current tolerance. In embodiments, the tolerance value includes a frequency tolerance.

In the results 900, the tolerance level 914 is specified as 0.2 volts. Amongst the data within the results 900, two data points, indicated as 910 and 912, have a difference value, indicated at column 916 that exceeds the absolute value of the tolerance level 914. For comparison point 910, the difference value is −0.250224, and for comparison point 912, the difference value is −0.245132. All the other comparison points have a difference value below the threshold of tolerance level 914. However, since one or more difference values exceed the threshold of tolerance level 914, the results are deemed as a failure case.

FIG. 10 illustrates comparison of analysis results that pass. In the results 1000, the tolerance level 1014 is specified as 0.2 volts. Amongst the data within the results 1000, the two data points, indicated as 1010 and 1012, have a difference value, indicated at column 1016 that does not exceed the absolute value of the tolerance level 1014. For data point 1010, the difference value is −0.191226 and for comparison point 1012, the difference value is −0.176112. Similarly, all the other comparison points have a difference values below the tolerance level. Since none of the difference values within results 1000 exceed the threshold of tolerance level 1014, the results are deemed as a pass case.

Figure 11:
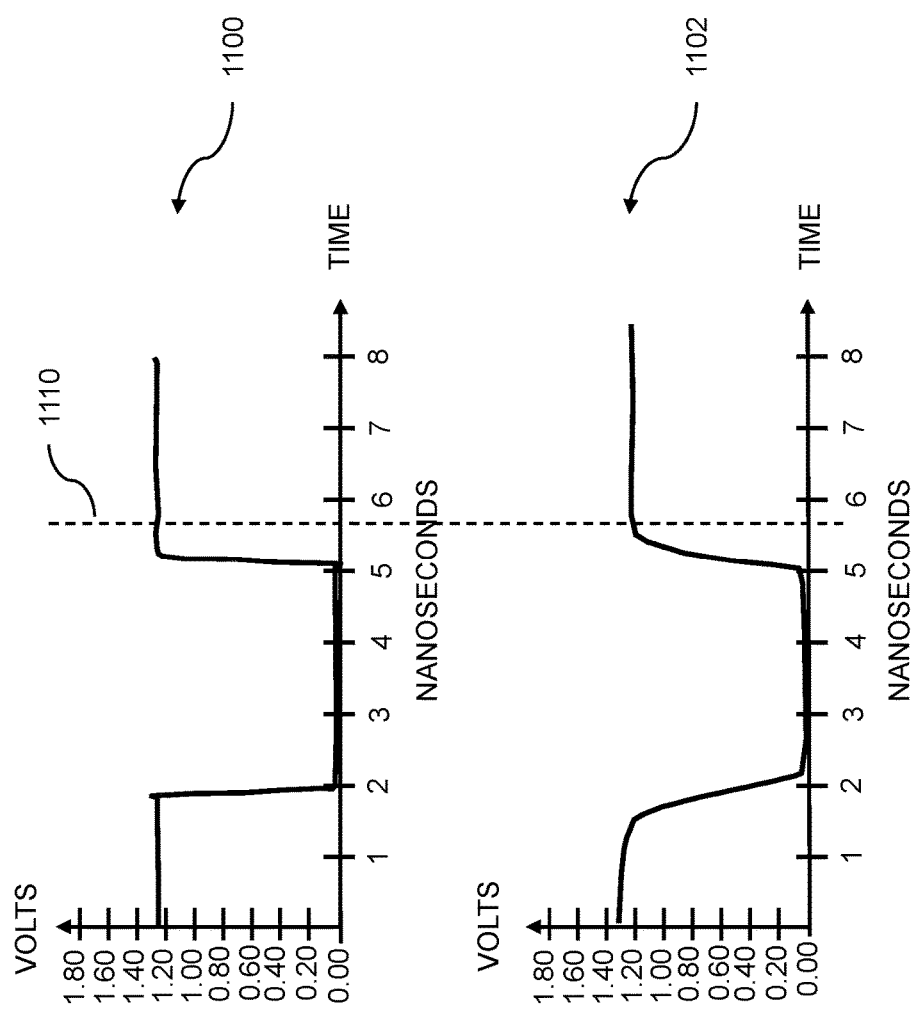
FIG. 11 illustrates waveforms that pass.

FIG. 11 illustrates waveforms that pass. In embodiments, waveform 1100 is an output waveform from a transistor level simulation, and waveform 1102 is an output waveform from a logical level simulation. At a time 1110 within each waveform, a voltage value is obtained. The voltage values are compared with each other, and if the values are within a predetermined tolerance, the waveforms 1100 and 1102 are deemed to be equivalent. In this example, at the time 1110, each waveform has a voltage of about 1.20 volts, and thus, the waveforms 1100 and 1102 are deemed equivalent.

Figure 12:
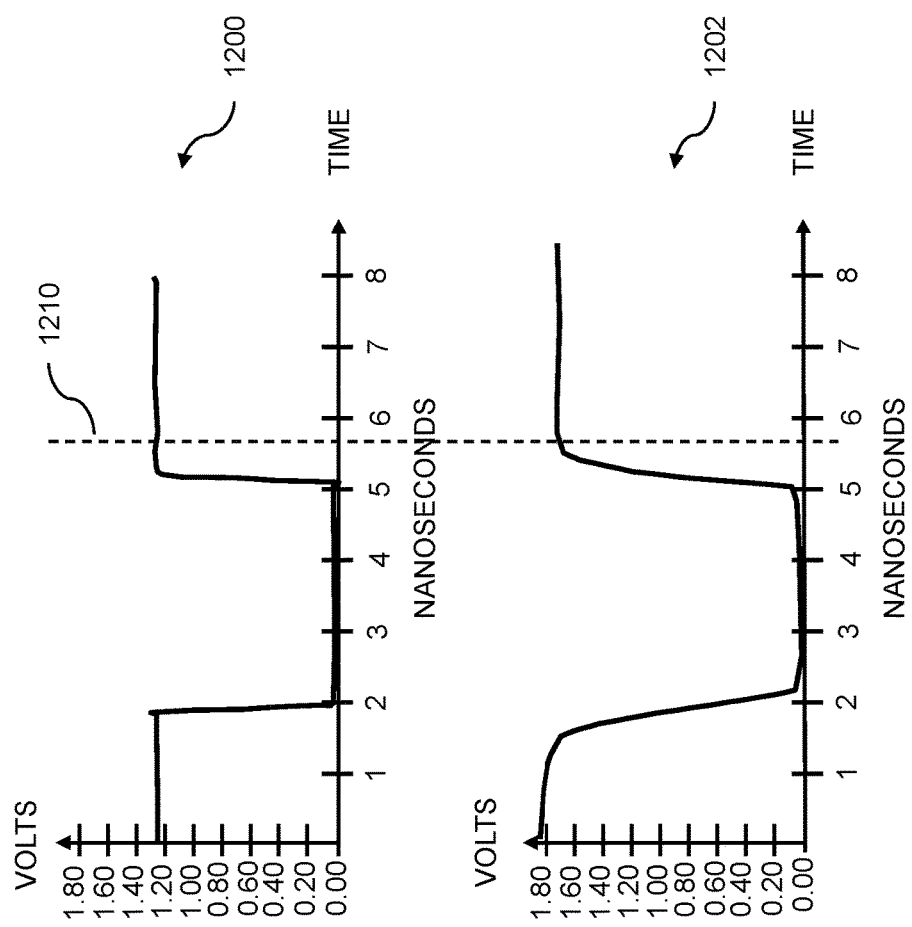
FIG. 12 illustrates waveforms that fail.

FIG. 12 illustrates waveforms that fail. In embodiments, waveform 1200 is an output waveform from a transistor level simulation, and waveform 1202 is an output waveform from a logical level simulation. At a time 1210 within each waveform, a voltage value is obtained. The voltage values are compared with each other, and if the values are within a predetermined tolerance, the waveforms 1200 and 1202 are deemed to be equivalent. In this example, at the time 1210, waveform 1200 has a voltage of about 1.20 volts, while waveform 1202 has a voltage of about 1.80 volts. If the predetermined tolerance is established at 0.3 volts, then the waveforms 1200 and 1202 are deemed nonequivalent since 1.80−1.20=0.5>0.3.

Figure 13:
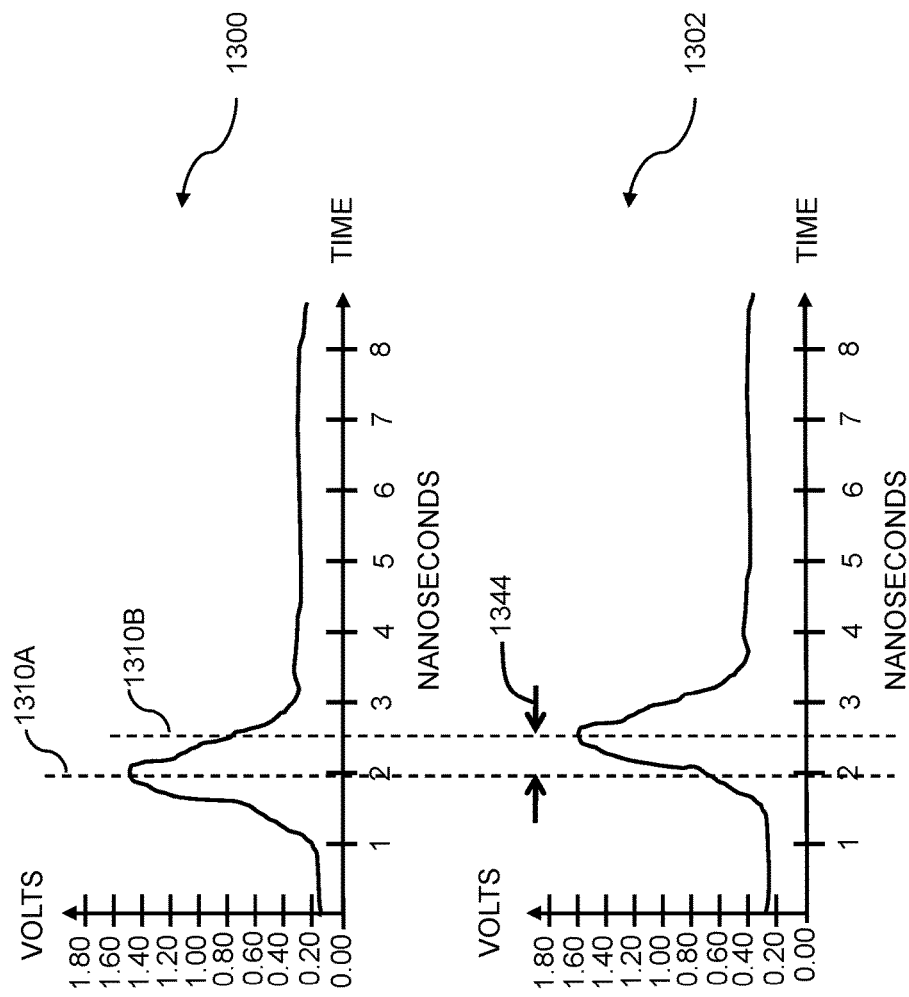
FIG. 13 illustrates waveforms showing peak identification.

FIG. 13 illustrates waveforms showing peak identification. In embodiments, waveform 1300 is an output waveform from a transistor level simulation, and waveform 1302 is an output waveform from a logical level simulation. In embodiments, each waveform can be processed for peak identification, and a peak time for each waveform is identified. The peak identification can be performed by determining the maximum point on the curve, a moving average, or other suitable method to determine a peak. In this example, waveform 1300 has a peak time at 1310A, while waveform 1302 has a peak time at 1310B. The temporal difference between peak time 1310A and 1310B is denoted by reference 1344. In this example, the temporal difference is about 0.5 nanoseconds. A predetermined temporal threshold can be established. If the peak time temporal difference is less than the predetermined temporal threshold, and the voltage difference at the respective peaks is less than a predetermined voltage threshold, then the waveforms are deemed to be equivalent.

Figure 14:
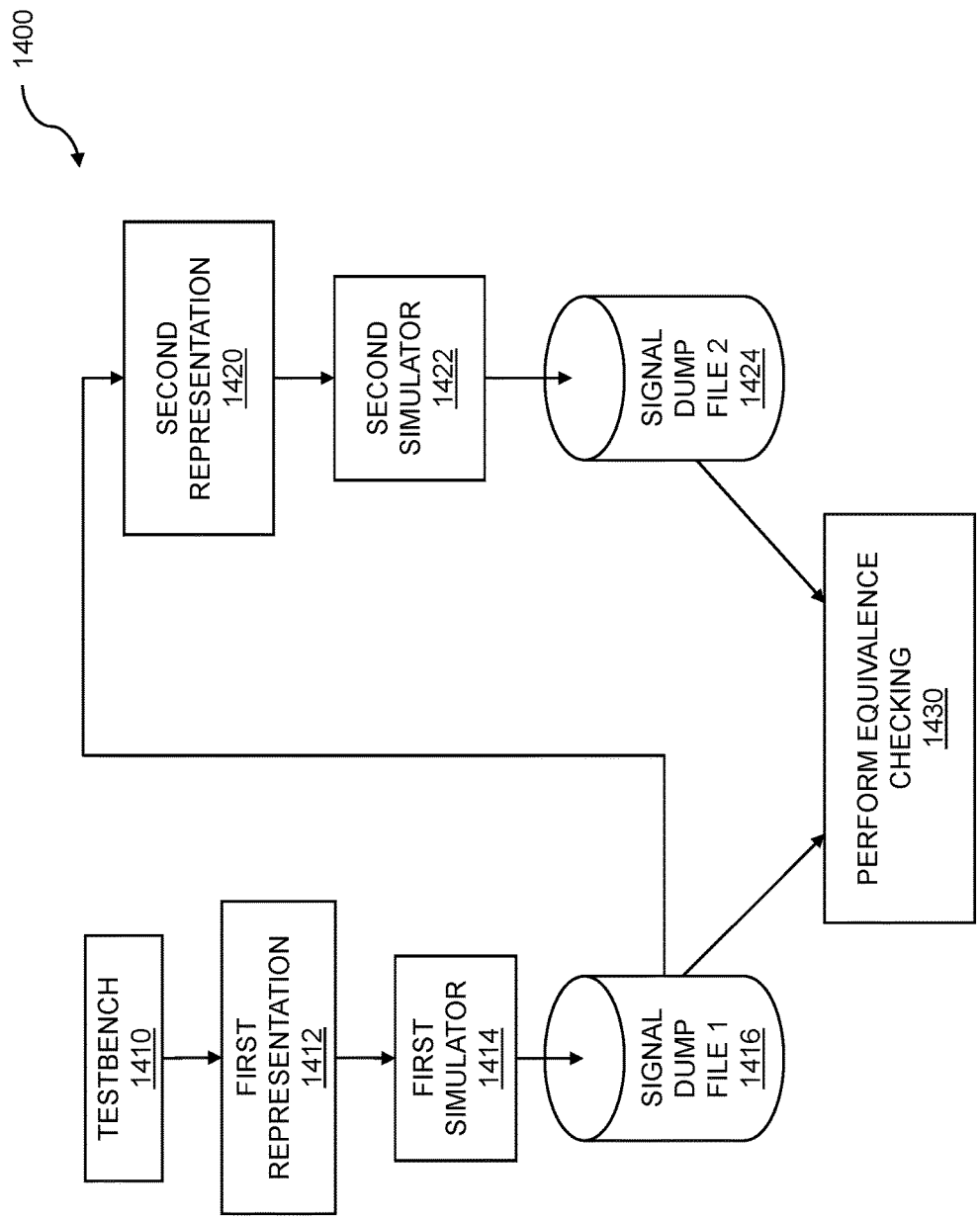
FIG. 14 is a block diagram for performing equivalence checking.

FIG. 14 is a block diagram for performing equivalence checking. Equivalence checking 1400 can be performed and can determine whether two or more representations of a given design can be equivalent. The testbench 1410 includes the collection of files/data that includes the circuit representations, the input stimulus, and the collection of output waveforms from each respective circuit representation (transistor level and HDL). From the testbench 1410, a first representation 1412 (e.g. a transistor level model) is accessed, and a first simulator 1414 is operated to produce a first signal dump file 1416. From the first signal dump file, the input stimulus waveform is input to a second representation 1420 (e.g. an HDL model), and a second simulator 1422 is operated on the input stimulus waveform and the output is stored in a second signal dump file 1424. Then, the results within signal dump file 1416 and signal dump file 1424 are compared and equivalence checking is performed 1430. Thus, in embodiments the performing equivalence checking between the first output waveforms and the second output waveforms includes comparing the first signal dump file and the second signal dump file.

The equivalence can be based on any of a variety of criteria including a threshold, a percentage, a tolerance, and so on. The equivalence checking can be performed using a variety of techniques. The topology of the model accuracy and equivalence checking flow can be based on the premise that two different representations of the same analog circuit, when given the exact same input stimulus, can have matching outputs. Thus, in embodiments, the first representation of the semiconductor circuit includes analog modelling. As shown in in the diagram of equivalence checking 1400, one implementation can be a SPICE™ netlist and a second implementation can be a SystemVerilog™ model. In embodiments, the simulating of the first representation is accomplished in context of a mixed-language co-simulation comprising a SPICE™ simulator and a Verilog™ simulator. Other representations can also be used.

Both of the implementations can have the same original design specification as the basis for development. In the initial phase of the design cycle, the simulations and engineering associated with the design methodology of both implementations can use an input stimulus that is unique to both flows. The approach can be used to measure accuracy of the model based on the "real" construct with that of the actual circuit. Therefore, the usage of a common input stimulus can occur only after both implementations have certain code stability and maturity. Once the common input stimulus has been created, the respective simulation environment (e.g. SPICE™ and SystemVerilog™) can be re-used to generate separate waveform dump files. These dump files can form the basis of the equivalence checking and can be used in the process of generating a report that can be visualized.

Figure 15:
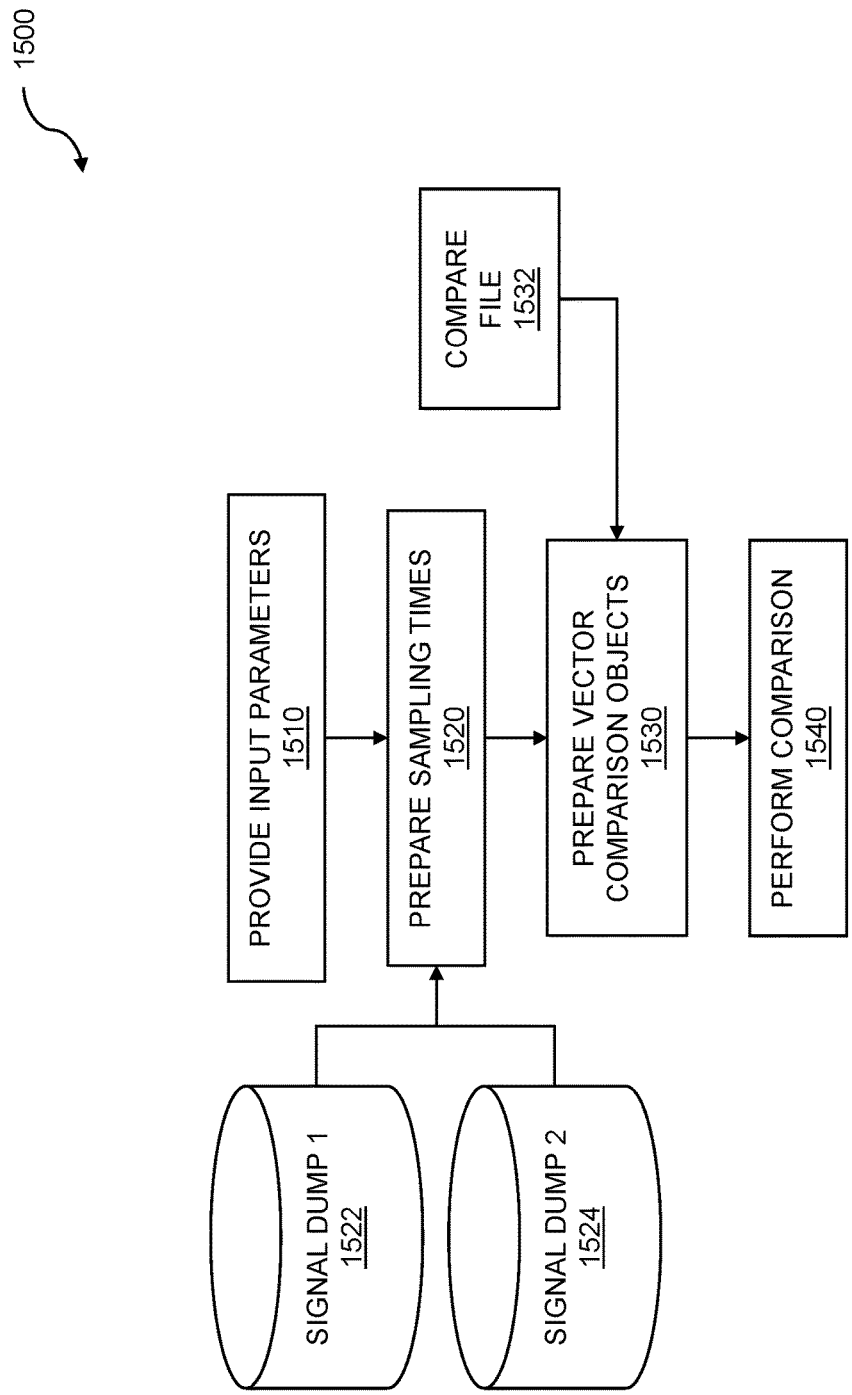
FIG. 15 is a flow diagram for configuration comparison.

FIG. 15 is a flow diagram for configuration comparison. The flow diagram 1500 starts with providing input parameters 1510. These input parameters can include, but are not limited to, time units, begin time, end time, shift values, tolerance values, and maximum error values, along with other criteria that can be used to determine equivalence of the two output waveforms. In some embodiments, the input parameters can include the specification of "don't care" regions, where certain data points or parts of the signal are not used in the determination of equivalence. This can be useful in cases where there is only a certain part of the output waveforms that are of interest for comparison. This allows convenient establishment of the portions of the output waveforms that are to be compared to each other. The flow continues with preparing sampling times 1520. In some embodiments, the same sampling times can be used for both output waveforms, such as depicted in FIG. 8. Thus, in some embodiments the first sampling times and the second sampling times substantially match. In some embodiments, the deviation between the first object and the second object occur when the first object and the second object are measured at substantially a same sample time. In other embodiments, different sampling times can be used for each output waveform, such as depicted in FIG. 13, where sample time 1310A is used to sample waveform 1300 and sample time 1310B is used to sample waveform 1302. The data from the first signal dump file 1522 and second signal dump file 1524 is sampled, and the flow continues with preparing vector comparison objects 1530. In embodiments, generating the first output waveforms is based on the simulating the first representation wherein the first output waveforms are provided to the first signal dump file. In some embodiments, a compare file 1532 is assembled, which can contain information used to generate vector comparison objects. This information can include setup parameters such as vector size and dimension. The dimensions of the vector comparison objects can include, but are not limited to, time, voltage, current, and/or frequency. The flow continues with performing a comparison 1540. The comparison can include comparing data points within each vector comparison object.

Figure 16:
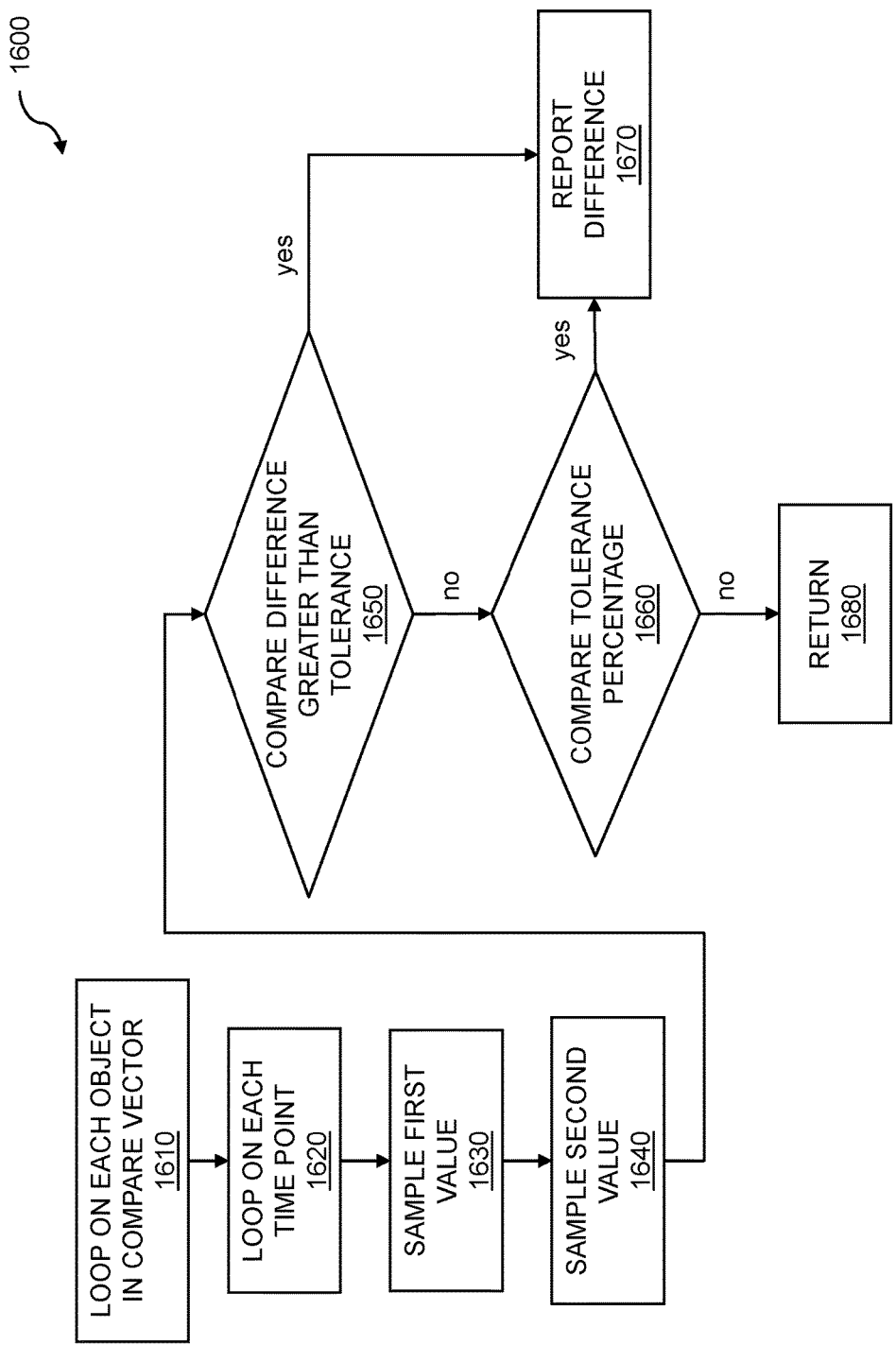
FIG. 16 is a flow diagram for difference comparison.

FIG. 16 is a flow diagram for difference comparison. Difference comparison 1600 can be performed for representations of a design. Each object in a vector can be compared between dump files. Samples can be extracted from dump files at given times. The differences between dump file samples can be found to be greater than a tolerance value. If the differences are greater than a tolerance value, then a difference between samples from dump files can be reported. A difference percentage can also be determined from a difference between two values divided by the first value. If the difference percentage for samples from dump files is greater than a tolerance percentage, then a difference can be reported.

The flow begins with performing a loop on each object in compare vector 1610. Each object can include a time point, along with one or more corresponding values such as voltage, current, and/or frequency. The flow continues with looping on each time point 1620 to parse each corresponding value. The flow continues with sampling a first value 1630 from a first vector comparison object, and sampling a second value 1640 from a second vector comparison object. The flow continues with comparing if a difference between the first value and second value is greater than a predetermined tolerance 1650. If yes, then the difference is reported 1670. If no, then the tolerance percentage is compared 1660. In embodiments, the tolerance percentage can represent a percentage difference between the first sampling value and the second sampling value. For example, if a predetermined tolerance percentage is established at 3.0 percent, then for a first value of 2.3 volts and a second value of 2.5 volts, the two points are deemed nonequivalent since 3 percent of 2.3 volts is 0.069 volts, and the difference between the first and second values is 0.20 volts, which exceeds the predetermined tolerance percentage value. If, at 1660, the tolerance percentage is exceeded, then the flow proceeds to 1670 and the difference is reported. If at 1660, the two sample values are within the tolerance percentage, then the flow proceeds to return 1680, and the process continues until all data within the compare vectors has been processed.

Based on the information reported, one or more of the circuit models can be updated. For example, different devices can be used in the transistor level model to more accurately reflect the operation of the logical model. This information can then be used in designing the implementation of an actual circuit, thus saving considerable design costs. Thus, embodiments include updating the first representation of the semiconductor circuit based on the equivalence checking. Additionally, embodiments can include updating the second representation of the semiconductor circuit based on the equivalence checking.

Figure 17:
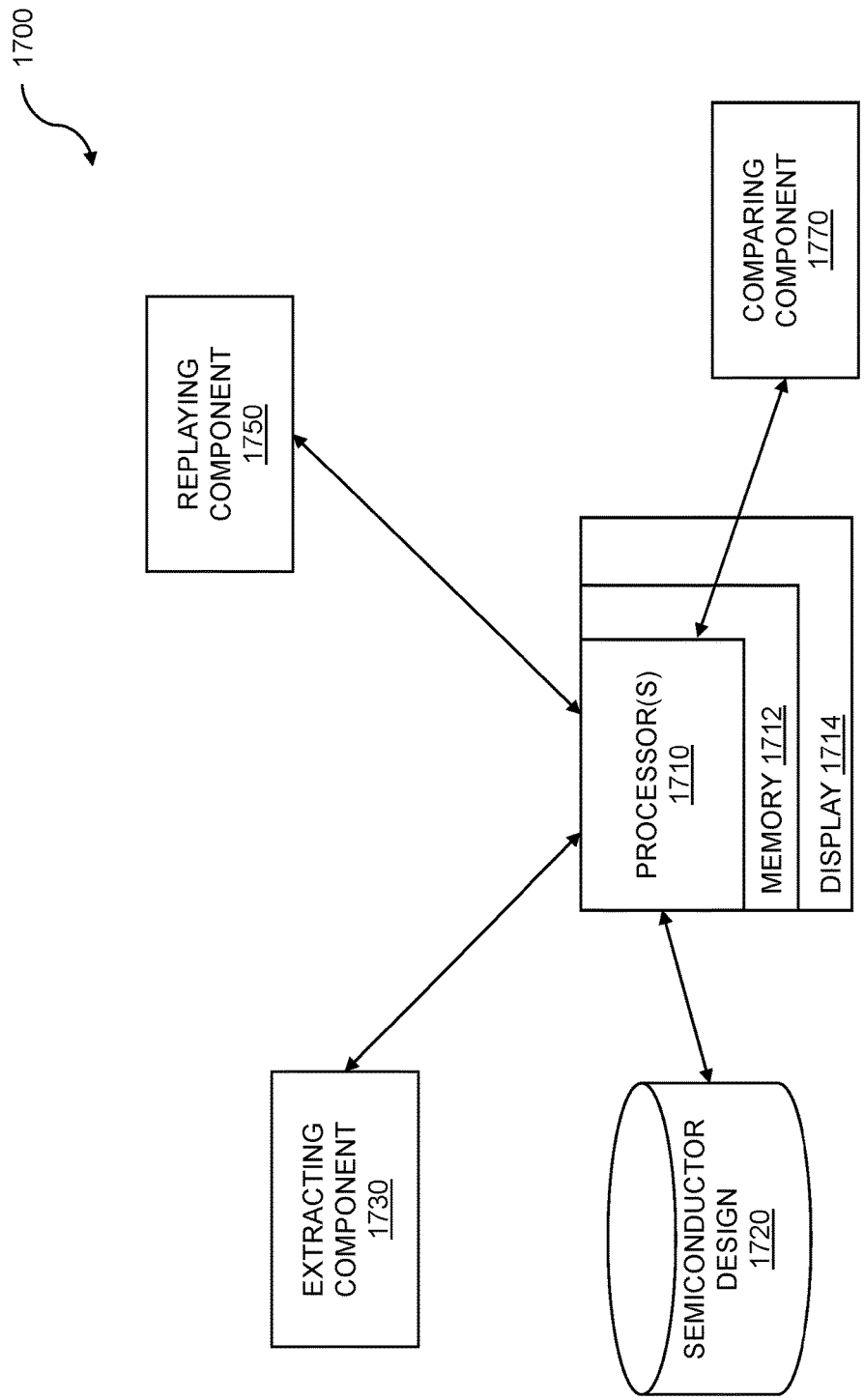
FIG. 17 is a system for equivalence checking of analog models.

FIG. 17 is a system 1700 for equivalence checking of analog models. The system 1700 can include one or more processors 1710 which are coupled to a memory 1712. The memory 1712 can be used to store, either temporarily or permanently, computer code, computer instructions, and computer information including calculated, temporary, and permanent data. The data can include any appropriate type or types of data including data for one or more semiconductor designs, architectures, descriptions, models, representations, etc. The design data can include one or more design representations, dump files, tolerance values, threshold values, and so on. The data can include other types of data such as system support information, system confirmation instructions, analysis results, etc. A display 1714 can also be present. The display can be any of a variety of electronic displays and screens, for example, and can include a computer display or screen, a laptop computer screen, a tablet screen, a smartphone display, a personal digital assistant (PDA) display, a handheld display, a remote display, a projector, a television, and so on.

The system 1700 can include a semiconductor design 1720. The semiconductor design 1720 can be stored in any appropriate storage device and medium including a hard disk drive (HDD), a solid-state drive (SSD), an optical disk drive (ODD), or another computer-readable storage medium. The semiconductor design can include representations of design such as logical representations, SPICE™ netlists, Verilog™ netlists, descriptions of design levels, hierarchies of design levels, descriptions of behavior, and so on. The system 1700 can include an extracting component 1730. The extracting component can extract an input stimulus that can be used as a common input stimulus for both a first representation and a second representation of a semiconductor circuit. The system 1700 can include a replaying component 1750. The replaying component 1750 can replay the common input stimulus into multiple circuit simulations, such as a transistor level simulation and a logical level simulation. In embodiments, replaying the common input stimulus signal set against the second representation includes simulating the second representation wherein the second output waveforms are provided to a second signal dump file. The system 1700 can include a comparing component 1770 for comparing the output waveforms that are generated by the replaying component 1750. The comparing component 1770 can include comparing data values against a tolerance value, against a percentage tolerance value, and can include performing temporal shifting and/or amplitude shifting as part of preprocessing for comparison. Additionally, the comparing component 1770 can perform peak identification, curve smoothing, low pass filtering, or other techniques for conditioning the output waveforms prior to comparing.

The system 1700 can include a computer system for design analysis comprising: a memory which stores instructions; one or more processors coupled to the memory wherein the one or more processors are configured to: extract an input signal set using a first representation of a semiconductor circuit; create a common input stimulus signal set for a second representation of the semiconductor circuit based on the input signal set extracted from the first representation of the semiconductor circuit; replay the common input stimulus signal set against the second representation of the semiconductor circuit; generate first output waveforms for outputs of the first representation and second output waveforms for outputs of the second representation of the semiconductor circuit using the common input stimulus signal set; and perform equivalence checking between the first output waveforms and the second output waveforms.

The system 1700 can include computer program product embodied in a non-transitory computer readable medium for design analysis, wherein the computer program product comprises code which causes one or more processors to perform operations of: extracting an input signal set using a first representation of a semiconductor circuit; creating a common input stimulus signal set for a second representation of the semiconductor circuit based on the input signal set extracted from the first representation of the semiconductor circuit; replaying the common input stimulus signal set against the second representation of the semiconductor circuit; generating first output waveforms for outputs of the first representation and second output waveforms for outputs of the second representation of the semiconductor circuit using the common input stimulus signal set; and performing equivalence checking between the first output waveforms and the second output waveforms.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer-implemented method for design analysis comprising:
    extracting an input signal set using a first representation of a semiconductor circuit;
    creating a common input stimulus signal set for a second representation of the semiconductor circuit based on the input signal set extracted from the first representation of the semiconductor circuit;
    replaying the common input stimulus signal set against the second representation of the semiconductor circuit;
    generating first output waveforms for outputs of the first representation and second output waveforms for outputs of the second representation of the semiconductor circuit using the common input stimulus signal set;
    preparing first sampling times for the first output waveforms;
    preparing second sampling times for the second output waveforms;
    generating a vector of comparison objects, wherein the vector of comparison objects includes objects in both the first output waveforms and the second output waveforms; and
    determining a deviation between a first object in the first output waveforms and a second object in the second output waveforms wherein the deviation exceeds a tolerance value.

2. The method of claim 1 wherein the extracting the input signal set from the first representation of the semiconductor circuit is based on simulating the first representation and providing results of the simulating the first representation to a first signal dump file.

3. The method of claim 2 wherein the generating the first output waveforms is based on the simulating the first representation wherein the first output waveforms are provided to the first signal dump file.

4. The method of claim 2 wherein the replaying the common input stimulus signal set against the second representation includes simulating the second representation wherein the second output waveforms are provided to a second signal dump file.

5. The method of claim 4 wherein the simulating of the first representation is accomplished in context of a mixed-language co-simulation comprising a SPICE™ simulator and a Verilog™ simulator.

6. The method of claim 4 wherein the performing equivalence checking between the first output waveforms and the second output waveforms includes comparing the first signal dump file and the second signal dump file.

7. The method of claim 1 wherein the first representation of the semiconductor circuit includes transistor level modeling.

8. The method of claim 1 wherein the first representation of the semiconductor circuit includes analog modeling.

9. The method of claim 1 wherein the second representation of the semiconductor circuit includes behavioral modeling.

10. The method of claim 1 wherein the second representation of the semiconductor circuit includes structural modeling.

11. The method of claim 1 wherein the creating the common input stimulus signal set for the second representation includes time shifting the input signal set extracted using the first representation of the semiconductor circuit.

12. The method of claim 1 wherein the creating the common input stimulus signal set for the second representation includes voltage shifting the input signal set extracted from the first representation of the semiconductor circuit.

13. The method of claim 1 further comprising time shifting the first output waveforms or the second output waveforms as part of the performing equivalence checking.

14. The method of claim 1 further comprising voltage shifting the first output waveforms or the second output waveforms as part of the performing equivalence checking.

15. The method of claim 1 wherein the performing equivalence checking includes evaluating using a tolerance value.

16. The method of claim 15 wherein the tolerance value includes a time tolerance.

17. The method of claim 15 wherein the tolerance value includes a voltage tolerance.

18. The method of claim 15 wherein the tolerance value includes a current tolerance.

19. The method of claim 15 wherein the tolerance value includes a frequency tolerance.

20. The method of claim 1 further comprising updating the first representation of the semiconductor circuit based on the equivalence checking.

21. The method of claim 1 further comprising updating the second representation of the semiconductor circuit based on the equivalence checking.

22. The method of claim 1 further comprising mapping signals from the first output waveforms to signals from the second output waveforms.

23. A computer system for design analysis comprising:
    a memory which stores instructions;
    one or more processors coupled to the memory wherein the one or more processors are configured to:
    extract an input signal set using a first representation of a semiconductor circuit;
    create a common input stimulus signal set for a second representation of the semiconductor circuit based on the input signal set extracted from the first representation of the semiconductor circuit;
    replay the common input stimulus signal set against the second representation of the semiconductor circuit;
    generate first output waveforms for outputs of the first representation and second output waveforms for outputs of the second representation of the semiconductor circuit using the common input stimulus signal set;
    prepare first sampling times for the first output waveforms;
    prepare second sampling times for the second output waveforms;

generate a vector of comparison objects, wherein the vector of comparison objects includes objects in both the first output waveforms and the second output waveforms; and determine a deviation between a first object in the first output waveforms and a second object in the second output waveforms wherein the deviation exceeds a tolerance value.

* * * * *